(12) United States Patent
Lee et al.

(10) Patent No.: US 9,176,381 B2
(45) Date of Patent: Nov. 3, 2015

(54) POSITIVE TYPE PHOTOSENSITIVE RESIN COMPOSITION

(75) Inventors: Jeong-Woo Lee, Uiwang-si (KR);
Yong-Sik Yoo, Uiwang-si (KR);
Hyun-Yong Cho, Uiwang-si (KR);
Ji-Young Jeong, Uiwang-si (KR);
Doo-Young Jung, Uiwang-si (KR);
Jong-Hwa Lee, Uiwang-si (KR);
Min-Kook Chung, Uiwang-si (KR);
Myoung-Hwan Cha, Uiwang-si (KR);
Hwan-Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 12/964,010

(22) Filed: Dec. 9, 2010

(65) Prior Publication Data

US 2011/0159428 A1 Jun. 30, 2011

(30) Foreign Application Priority Data

Dec. 29, 2009 (KR) ........................ 10-2009-0133229

(51) Int. Cl.
*G03F 7/039* (2006.01)
*G03F 7/075* (2006.01)

(52) U.S. Cl.
CPC .............. *G03F 7/039* (2013.01); *G03F 7/0755* (2013.01)

(58) Field of Classification Search
CPC ... G03F 7/0038; G03F 7/0045; G03F 7/2002; G03F 7/0039; C08L 79/08; C09D 179/08
USPC ......................................... 522/31; 430/270.1
See application file for complete search history.

(56) References Cited

U.S. PATENT DOCUMENTS

| 2,772,975 A | 12/1956 | Rickers |
| 2,797,213 A | 6/1957 | Moore |
| 3,669,658 A | 6/1972 | Yonezawa et al. |
| 5,077,378 A | 12/1991 | Mueller et al. |

(Continued)

FOREIGN PATENT DOCUMENTS

| CN | 1356356 | 7/2002 |
| CN | 1831648 A | 9/2006 |

(Continued)

OTHER PUBLICATIONS

Iwashita et al.; JP2006-349700 machine English translation; pub. Dec. 2006.*

(Continued)

*Primary Examiner* — Mark Eashoo
*Assistant Examiner* — Jessica Roswell
(74) *Attorney, Agent, or Firm* — Additon, Higgins & Pendleton, P.A.

(57) ABSTRACT

This disclosure relates to a positive photosensitive resin composition including (A) a resin precursor including a polybenzoxazole precursor, a polyamic acid, or a combination thereof, (B) a dissolution-controlling agent having a boiling point ranging from about 210° C. to about 400° C. and a polarity ranging from about 1 D to about 4 D, (C) an acid generator, (D) a silane-based compound, and (E) a solvent. The polybenzoxazole precursor includes a repeating unit represented by Chemical Formula 1, or both of repeating units represented by Chemical Formulae 1 and 2 and has a thermally polymerizable functional group at at least one end. The polyamic acid includes a repeating unit of Chemical Formulae 50 and 51.

11 Claims, 2 Drawing Sheets

(56) References Cited

U.S. PATENT DOCUMENTS

| | | |
|---|---|---|
| 5,106,899 A | 4/1992 | Maresca |
| 5,114,826 A | 5/1992 | Kwong et al. |
| 5,376,499 A | 12/1994 | Hammerschmidt et al. |
| 5,449,584 A | 9/1995 | Banba et al. |
| 5,486,447 A | 1/1996 | Hammerschmidt et al. |
| 5,858,584 A | 1/1999 | Okabe et al. |
| 6,001,517 A | 12/1999 | Kawamonzen |
| 6,207,356 B1 | 3/2001 | Banba et al. |
| 6,232,032 B1* | 5/2001 | Nunomura et al. ........... 430/191 |
| 6,376,151 B1 | 4/2002 | Takahashi et al. |
| 6,808,862 B2 | 10/2004 | Kodama |
| 6,929,890 B2 | 8/2005 | Miyoshi et al. |
| 7,056,641 B2 | 6/2006 | Naiini et al. |
| 7,218,082 B2 | 5/2007 | Walter et al. |
| 7,371,506 B2 | 5/2008 | Fujii et al. |
| 7,416,830 B2 | 8/2008 | Naiini et al. |
| 7,687,208 B2 | 3/2010 | Shibui |
| 8,080,350 B2 | 12/2011 | Banba et al. |
| 8,198,002 B2 | 6/2012 | Jung et al. |
| 2002/0090564 A1 | 7/2002 | Suwa et al. |
| 2004/0142275 A1 | 7/2004 | Komatsu |
| 2004/0229167 A1 | 11/2004 | Naiini et al. |
| 2005/0202337 A1* | 9/2005 | Miyoshi et al. ............ 430/270.1 |
| 2008/0094872 A1* | 4/2008 | Lee et al. ..................... 365/129 |
| 2009/0068587 A1 | 3/2009 | Maeda et al. |
| 2009/0202794 A1 | 8/2009 | Shibui |
| 2011/0171578 A1 | 7/2011 | Cho et al. |
| 2011/0294066 A1 | 12/2011 | Hasegawa |
| 2012/0129988 A1 | 5/2012 | Fujimaru et al. |

FOREIGN PATENT DOCUMENTS

| | | |
|---|---|---|
| CN | 101727006 A | 6/2010 |
| CN | 102109763 A | 6/2011 |
| EP | 0219626 A2 | 4/1987 |
| EP | 0424940 A2 | 5/1991 |
| EP | 0491188 A2 | 6/1992 |
| JP | 62-099747 | 5/1987 |
| JP | 63-96162 A | 4/1988 |
| JP | 03-209478 A | 9/1991 |
| JP | 04-031860 | 2/1992 |
| JP | 11-044948 A | 2/1992 |
| JP | 11-65107 A | 3/1993 |
| JP | 07-281441 | 10/1995 |
| JP | 08-022118 A | 1/1996 |
| JP | 09-302221 A | 11/1997 |
| JP | 10-307393 | 11/1998 |
| JP | 2000-199958 A | 7/2000 |
| JP | 2000-292913 A | 10/2000 |
| JP | 2003-248311 | 9/2003 |
| JP | 2004-054254 | 2/2004 |
| JP | 2004-170611 | 6/2004 |
| JP | 2004-334089 | 11/2004 |
| JP | 2005-043883 A | 2/2005 |
| JP | 2006-178437 A | 7/2006 |
| JP | 2006-349700 | * 12/2006 ............. G03F 7/037 |
| JP | 2007-304125 | 11/2007 |
| JP | 2008-139328 | 6/2008 |
| JP | 4105919 B2 | 6/2008 |
| KR | 10-0183990 | 4/1999 |
| KR | 10-1999-0088649 A | 12/1999 |
| KR | 10-2001-0088824 A | 9/2001 |
| KR | 10-2006-0002051 A | 1/2006 |
| KR | 10-2006-0023520 A | 3/2006 |
| KR | 10-2006-0085166 A | 7/2006 |
| KR | 10-2007-0007026 A | 1/2007 |
| KR | 10-2008-0072083 A | 8/2008 |
| KR | 10-2009-0019731 A | 2/2009 |
| KR | 10-2009-0051028 A | 5/2009 |
| KR | 10-2009-0056737 A | 6/2009 |
| KR | 10-2010-0036115 A | 4/2010 |
| KR | 10-2011-0076492 A | 7/2011 |
| TW | 200504464 A | 2/2005 |
| TW | 200712778 | 4/2007 |
| TW | 201015224 | 4/2010 |
| TW | 201035242 | 10/2010 |
| WO | 2004/109400 A2 | 12/2004 |
| WO | 2008-020573 A1 | 2/2008 |
| WO | 2009/145227 A1 | 12/2009 |
| WO | 2010/035925 A1 | 4/2010 |
| WO | 2011/004706 A1 | 1/2011 |

OTHER PUBLICATIONS

"N-methylpyrrolidone", Solvent properties, (http://macro.lsu.edu/HowTo/solvents/N-Methylpyrrolidone.htm).*

CRC Handbook of Chemistry and Physics; Haynes et al.; 9th ed. 2013.*

Gore et al. "Molecular Polarisability. The Conformations of Diphenyl Ketone, Dimesityl Ketone, and Mesityl Phenyl Ketone as Solutes", J. Chem. Soc. (B), 1967, p. 741-742.*

International Search Report and Written Opinion in commonly owned International Application No. PCT/KR2008/007903 dated Aug. 10, 2009, pp. 1-6.

Search Report in commonly owned Taiwanese Application No. 100141829 dated Oct. 10, 2013, pp. 1-2.

Chinese Search Report in commonly owned Chinese Application No. 201103490545 dated Jan. 25, 2013, pp. 1-3.

Taiwanese Search Report in counterpart Taiwanese Application No. 99144461 dated Mar. 28, 2013, pp. 1.

Office Action in commonly owned U.S. Appl. No. 13/073,005 mailed Mar. 28, 2011, pp. 1-8.

Office Action in commonly owned U.S. Appl. No. 13/073,005 mailed Mar. 7, 2013, pp. 1-7.

* cited by examiner

| 1(No residue) | 2(Little residue) | 3(much residue) |
|---|---|---|
|  |  |  |
|  |  |  |

POSITIVE TYPE PHOTOSENSITIVE RESIN COMPOSITION

CROSS-REFERENCE TO RELATED APPLICATION

This application claims priority to and the benefit of Korean Patent Application No. 10-2009-0133229 filed in the Korean Intellectual Property Office on Dec. 29, 2009, the entire disclosure of which is incorporated herein by reference.

FIELD OF THE INVENTION

This application relates to a positive photosensitive resin composition, a photosensitive resin layer manufactured using the positive photosensitive resin composition, and a semiconductor device including the photosensitive resin layer.

BACKGROUND OF THE INVENTION

Conventional surface protective layers and interlayer insulating layers for semiconductor devices can include a polyimide resin, which can have excellent heat resistance and electrical characteristics, and mechanical characteristics, among other properties.

Polyimide resins have recently been used in the form of a photosensitive polyimide precursor composition. This polyimide precursor composition can be coated on a semiconductor device, patterned by ultraviolet (UV) rays, developed, and heat imidized to easily form a surface protective layer, an interlayer insulating layer, and the like. Recently, semiconductor devices have become thinner and smaller but with increased chip integration.

A positive photosensitive polyimide precursor composition can include a polyimide precursor of polyamic acid, a photosensitive material of diazonaphthoquinone, and the like. However, the positive photosensitive polyimide precursor composition may not provide a desired pattern, because the carbonic acid of the polyamidic acid used therein can be too highly soluble in an alkali.

Unlike the positive photosensitive polyimide precursor composition, a region exposed to radiation should rapidly dissolve during development, while dissolution of a region which is not exposed to radiation should be suppressed in the patterning process. However, since conventional materials may not effectively suppress dissolution of an unexposed region and rapidly dissolve an exposed region, the coated layer can be thinner after development, even when more energy is used for patterning.

Japanese Patent Laid-Open Publication Pyeung 3-209478 discloses a photosensitive polyimide-based resin that can be developed in an alkali aqueous solution. Japanese Patent Publication Pyeung 11-044948 and Japanese Patent Laid-Open Publication Pyeung 11-65107 disclose a positive material prepared by combining a polyimide or a polyamide having a phenolic hydroxyl group with diazonaphthoquinone. However, this resin can result in poor optical transmission and may not form a pattern on a 10 micrometer or thicker layer. In addition, since the resin has a low molecular weight in terms of its development properties and is included in a smaller amount than diazonaphthoquinone as a photoresist, there can be problems associated with its use, such as low concentration and strength deterioration of a layer.

In order to solve this problem, Japanese Patent Laid-Open Publication No. Pyeung 10-30739 discloses a material including a hydroxyl phenol group introduced through an ester bond instead of carbonic acid. However, this material may be insufficiently developed, which can cause problems such as reduced layer thickness and delamination of the resin from a substrate.

Japanese Patent Publication Soh 63-96162 discloses a material prepared by mixing a diazonaphthoquinone compound with a polybenzoxazole precursor. However, it can be difficult to obtain a desired pattern after development using this material, since layer thickness can decrease in the unexposed region.

A polybenzoxazole precursor with a higher molecular weight can be used to reduce the decrease in layer thickness. Increasing the molecular weight of the polybenzoxazole precursor, however, may cause development residue, and thus can deteriorate resolution and extend development time.

Japanese Patent Laid-Open Publication No. Pyeung 9-302221 and Japanese Patent Laid-Open Publication No. 2000-292913 disclose a method of suppressing loss of layer thickness in an unexposed region by adding a particular phenol compound to a polybenzoxazole precursor composition. These methods, however, may not sufficiently suppress the decrease in layer thickness. Accordingly, there is still a need for a material and method which can prevent or minimize the generation of residue and also can effectively suppress loss of layer thickness.

In addition, there is a need for a dissolution-controlling agent, since phenol is decomposed or negatively reacts at a high temperature during thermal curing, or forms micropores in a layer during high temperature evaporation, which can significantly damage mechanical properties of the cured layer. It also should be free from sensitivity deterioration and be solution-storage stable depending on its amount.

SUMMARY OF THE INVENTION

An exemplary embodiment of the present invention provides a positive photosensitive resin composition that can have excellent sensitivity and resolution, can provide a good pattern, and can provide excellent residue removal.

Another embodiment of the present invention provides a photosensitive resin layer prepared using the positive photosensitive resin composition.

Yet another embodiment of the present invention provides a semiconductor device including the photosensitive resin layer.

The embodiments of the present invention are not limited to the above technical purposes, and a person of ordinary skill in the art can understand other technical purposes.

According to an embodiment of the present invention, provided is a positive photosensitive resin composition including (A) a resin precursor including a polybenzoxazole precursor, a polyamic acid, or a combination thereof, (B) a dissolution-controlling agent having a boiling point ranging from about 210° C. to about 400° C. and a polarity ranging from about 1 D to about 4 D, (C) an acid generator, (D) a silane-based compound, and (E) a solvent. The polybenzoxazole precursor includes a repeating unit represented by the following Chemical Formula 1 or repeating units represented by the following Chemical Formulae 1 and 2, and also a thermally polymerizable functional group at at least one end. The polyamic acid may include repeating units represented by the following Chemical Formulae 50 and 51.

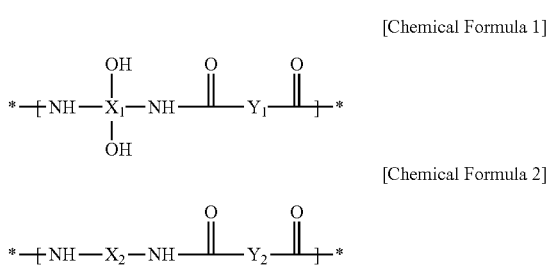

[Chemical Formula 1]

[Chemical Formula 2]

In Chemical Formulae 1 and 2, $X_1$ is an aromatic organic group or a quadrivalent to hexavalent aliphatic organic group, $Y_1$ and $Y_2$ are the same or different and are independently an aromatic organic group or a divalent to hexavalent aliphatic organic group, and $X_2$ is an aromatic organic group, a divalent to hexavalent aliphatic organic group, a divalent to hexavalent alicyclic organic group, or an organic group represented by the following Chemical Formula 3.

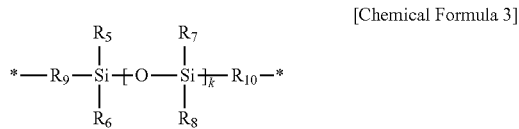

[Chemical Formula 3]

In Chemical Formula 3, $R_5$ to $R_8$ are the same or different and are independently substituted or unsubstituted alkyl, substituted or unsubstituted aryl, substituted or unsubstituted alkoxy, or hydroxy, $R_9$ and $R_{10}$ are the same or different and are independently substituted or unsubstituted alkylene or substituted or unsubstituted arylene, and k is an integer ranging from 1 to 50.

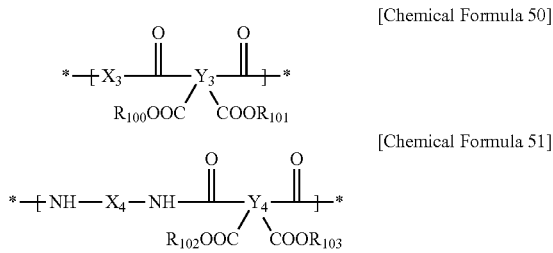

[Chemical Formula 50]

[Chemical Formula 51]

In Chemical Formulae 50 and 51, $X_3$ is an aromatic organic group or a divalent to hexavalent alicyclic organic group, $Y_3$ and $Y_4$ are the same or different and are independently an aromatic organic group or a quadrivalent to hexavalent alicyclic organic group, $X_4$ is an aromatic organic group, a divalent to hexavalent alicyclic organic group, or a functional group represented by Chemical Formula 3, and $R_{100}$ to $R_{103}$ are the same or different and are independently hydrogen or substituted or unsubstituted C1 to C20 alkyl.

According to another embodiment of the present invention, a photosensitive resin layer prepared using the positive photosensitive resin composition is provided.

According to still another embodiment of the present invention a semiconductor device including the photosensitive resin layer is provided.

Hereinafter, embodiments of the present invention will be described in detail.

The positive photosensitive resin composition for patterning can have high resolution with minimal or no development residue by using a dissolution-controlling agent having different boiling point and polarity to a solvent to accelerate plasticity of an exposed region during the development and to minimize layer thickness loss by maximizing dissolution suppression effects of an unexposed region.

DETAILED DESCRIPTION

Figure 1:
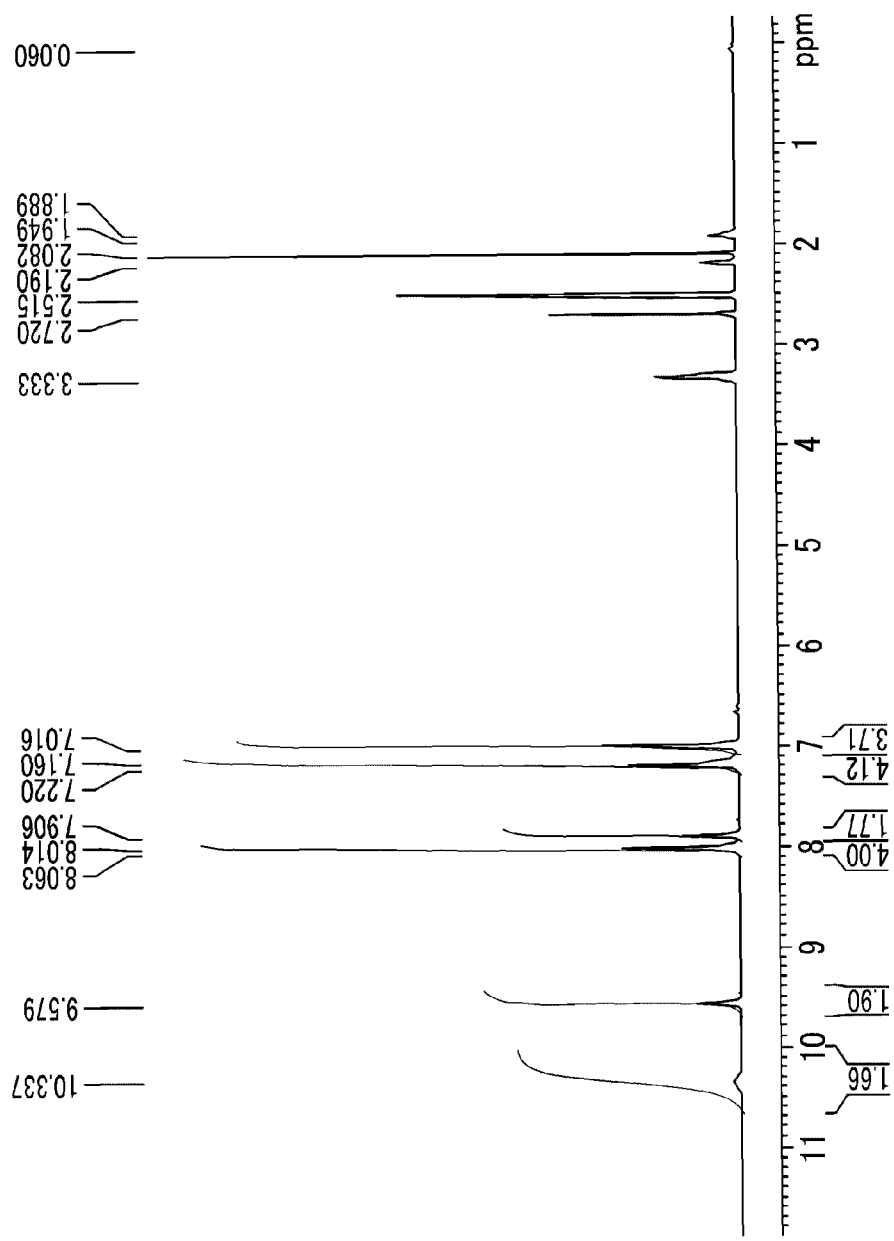
FIG. 1 is a graph showing the $^1$H-NMR structure of a polybenzoxazole precursor, PBO-2, prepared according to Synthesis Example 2.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to a group substituted with at least one or more substituents such as halogen (such as fluorine F), hydroxy, nitro, cyano, amino (—$NH_2$, —NH(R), or —N(R') R"), wherein R, R', and R" are independently C1 to C10 alkyl), amidino, hydrazine, hydrazone, carboxyl, alkyl, aryl, alkenyl, alkynyl, heteroaryl, heterocyclic, or a combination thereof in place of one or more hydrogen atoms.

As used herein, when a specific definition is not otherwise provided, the term "alkyl" refers to C1 to C30 alkyl, for example C1 to C16 alkyl, the term "alkylene" refers to C1 to C30 alkylene, for example C1 to C16 alkylene, the term "alkenyl" refers to C2 to C30 alkenyl, for example C2 to C16 alkenyl, the term "alkynyl" refers to C2 to C30 alkynyl, for example C2 to C16 alkynyl, the term "alkoxy" refers to C1 to C30 alkoxy, for example C1 to C16 alkoxy, the term "aryl" refers to C6 to C30 aryl, for example C6 to C18 aryl, the term "arylene" refers to C6 to C30 arylene, for example C6 to C18 arylene, the term "heteroaryl" refers to C2 to C30 heteroaryl, for example C1 to C16 heteroaryl, and the term "heterocyclic" refers to C2 to C30 heterocyclic, for example C2 to C18 heterocyclic.

As used herein, when a specific definition is not provided, the term "aliphatic organic group" refers to C1 to C30 alkyl, C2 to C30 alkenyl, or C2 to C30 alkynyl, the terms "alicyclic organic group" and "alicyclic group" refer to C3 to C30 cycloalkyl, C3 to C30 cycloalkenyl, or C3 to C30 cycloalkynyl, and the term "aromatic organic group" refers to C6 to C30 aryl or C2 to C30 heteroaryl.

Also as used herein, when a specific definition is not otherwise provided, the term "hetero" refers to a group including 1 to 20, for example 1 to 15, and as another example 1 to 5, heteroatoms comprising one or more of N, O, S, P, Si, and combinations thereof.

According to one embodiment of the present invention, a photosensitive resin composition includes (A) a polybenzoxazole precursor including a repeating unit represented by the above Chemical Formula 1 or repeating units represented by the following Chemical Formulae 1 and 2 and including a thermal polymerizable functional group at at least one end, (B) a dissolution-controlling agent of the component (A), and (C) an acid generator.

Exemplary components included in the photosensitive resin composition will hereinafter be described in detail.

(A) Resin Precursor

The resin precursor may be a polybenzoxazole precursor, polyamic acid, or a combination thereof.

The polybenzoxazole precursor may include a repeating unit represented by the following Chemical Formula 1 or repeating units represented by the following Chemical Formulae 1 and 2 and further may include a thermal polymerizable functional group at at least one end.

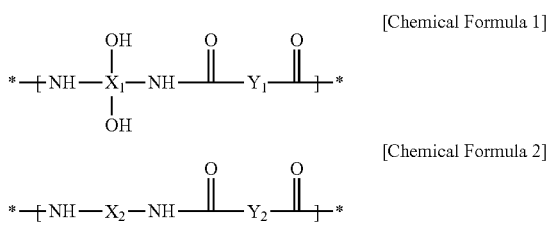

[Chemical Formula 1]

[Chemical Formula 2]

In Chemical Formulae 1 and 2, $X_1$ is an aromatic organic group or a quadrivalent to hexavalent aliphatic organic group, $Y_1$ and $Y_2$ are the same or different and are independently an aromatic organic group or a divalent to hexavalent aliphatic organic group, and $X_2$ is an aromatic organic group, a divalent to hexavalent aliphatic organic group, a divalent to hexavalent alicyclic organic group, or an organic group represented by the following Chemical Formula 3.

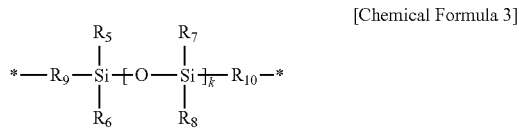

[Chemical Formula 3]

In Chemical Formula 3, $R_1$ and $R_2$ are the same or different and are independently substituted or unsubstituted alkyl, substituted or unsubstituted aryl, substituted or unsubstituted alkoxy, or hydroxy, $R_3$ and $R_4$ are the same or different and are independently substituted or unsubstituted alkylene or substituted or unsubstituted arylene, and k is an integer ranging from 1 to 50.

The polybenzoxazole precursor has no particular limit in type, but may include a random, block, or alternating copolymer. In addition, when the polybenzoxazole precursor includes both of repeating units of Chemical Formulae 1 and 2, the repeating unit of Chemical Formula 1 may be included in an amount ranging from about 60 mol % or more to about less than 100 mol %. In some embodiments, a repeating unit represented by the above Chemical Formula 1 may be included in an amount ranging from about 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 mol % and a repeating unit represented by the above Chemical Formula 2 may be included in an amount ranging from about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 mol %. Further, according to some embodiments of the present invention, the amount of a repeating unit represented by the above Chemical Formula 1 and/or the above Chemical Formula 2 can be in a range from about any of the foregoing amounts to about any other of the foregoing amounts.

$X_1$ may be a residual group derived from an aromatic diamine such as but not limited to 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2'-bis(3-amino-4-hydroxy-5-trifluoromethylphenyl) hexafluoropropane, 2,2'-bis(3-amino-4-hydroxy-6-trifluoromethylphenyl)hexafluoropropane, 2,2'-bis(3-amino-4-hydroxy-2-trifluoromethylphenyl)hexafluoropropane, 2,2'-bis (4-amino-3-hydroxy-5-trifluoromethylphenyl) hexafluoropropane, 2,2'-bis(4-amino-3-hydroxy-6-trifluoromethylphenyl)hexafluoropropane, 2,2'-bis(4-amino-3-hydroxy-2-trifluoromethylphenyl)hexafluoropropane, 2,2'-bis(3-amino-4-hydroxy-5-pentafluoroethylphenyl) hexafluoropropane, 2-(3-amino-4-hydroxy-5-trifluoromethylphenyl)-2'-(3-amino-4-hydroxy-5-pentafluoro ethylphenyl)hexafluoropropane, 2-(3-amino-4-hydroxy-5-trifluoromethylphenyl)-2'-(3-hydroxy-4-amino-5-trifluoromethylphenyl)hexafluoropropane, 2-(3-amino-4-hydroxy-5-trifluoromethylphenyl)-2'-(3-hydroxy-4-amino-6-trifluoromethylphenyl)hexafluoropropane, 2-(3-amino-4-hydroxy-5-trifluoromethylphenyl)-2'-(3-hydroxy-4-amino-2-trifluoromethylphenyl)hexafluoropropane, 2-(3-amino-4-hydroxy-2-trifluoromethylphenyl)-2'-(3-hydroxy-4-amino-5-trifluoromethylphenyl)hexafluoropropane, 2-(3-amino-4-hydroxy-6-trifluoromethylphenyl)-2'-(3-hydroxy-4-amino-5-trifluoromethylphenyl)hexafluoropropane, and the like, and combinations thereof.

In addition, $X_1$ may be a compound represented by the following Chemical Formulae 4 and 5 or a combination thereof.

[Chemical Formula 4]

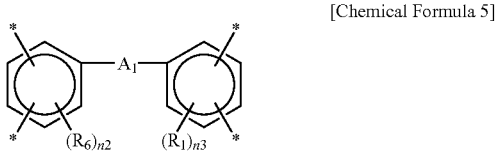

[Chemical Formula 5]

In Chemical Formulae 4 and 5, $A_1$ is O, CO, $CR_8R_9$, $SO_2$, S, or a single bond, $R_8$ and $R_9$ are the same or different and are independently hydrogen or substituted or unsubstituted alkyl, and in one embodiment $R_8$ and $R_9$ are fluoroalkyl, $R_5$ to $R_7$ are the same or different and are independently hydrogen, substituted or unsubstituted alkyl, hydroxy, carboxylic acid, or thiol, $n_1$ is an integer of 1 or 2, and $n_2$ and $n_3$ are the same or different and are independently integers ranging from 1 to 3.

$X_2$ may be derived from an aromatic diamine, a silicon diamine, or an alicyclic diamine.

Examples of the aromatic diamine include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, and the like, and combinations thereof.

Examples of the silicon diamine include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

Examples of the alicyclic diamine include without limitation cyclohexyldiamine, methylenebiscyclohexylamine, and the like, and combinations thereof.

The aromatic diamine monomers can be used singularly or in combination. The aromatic diamine monomer, silicon diamine monomer, or alicyclic diamine may also be used singularly or as a mixture thereof.

$Y_1$ and $Y_2$ may be residual groups derived from dicarboxylic acid or dicarboxylic acid derivatives.

Examples of the dicarboxylic acid include without limitation $Y(COOH)_2$ (wherein Y is the same as $Y_1$ and $Y_2$ of Chemical Formula 1).

Examples of the carboxylic acid derivative include without limitation a carbonyl halide derivative or an active compound of an active ester derivative obtained by reacting $Y(COOH)_2$ with 1-hydroxy-1,2,3-benzotriazole. Examples of the carboxylic acid derivative include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

$Y_1$ and $Y_2$ may include one of the functional groups represented by the following Chemical Formulae 6 to 8.

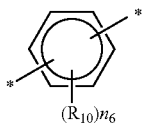

[Chemical Formula 6]

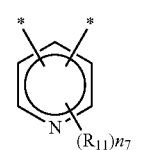

[Chemical Formula 7]

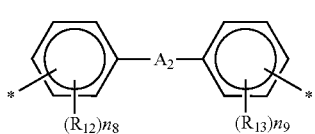

[Chemical Formula 8]

In Chemical Formulae 6 to 8, $R_{10}$ to $R_{13}$ are the same or different and are independently hydrogen or substituted or unsubstituted alkyl, $n_6$, $n_8$, and $n_9$ are the same or different and are independently integers ranging from 1 to 4, $n_7$ is an integer ranging from 1 to 3, $A_2$ is O, $CR_{14}R_{15}$, CO, CONH, S, or $SO_2$, wherein $R_{14}$ and $R_{15}$ are the same or different and are independently hydrogen or substituted or unsubstituted alkyl or fluoroalkyl.

In addition, the polybenzoxazole precursor includes a thermally polymerizable functional group, which can be derived from a reactive end-capping monomer at either one end thereof or at both ends thereof.

Examples of the reactive end-capping monomer include without limitation monoamines including double bonds, monoanhydrides including double bonds, and the like, and combinations thereof.

Examples of the monoamines including double bonds include without limitation toluidine, dimethylaniline, ethylaniline, aminophenol, aminobenzylalcohol, aminoindan, aminoacetonephenone, and the like, and combinations thereof.

Examples of the monoanhydrides include without limitation 5-norbornene-2,3-dicarboxylanhydride represented by the following Chemical Formula 9, 3,6-epoxy-1,2,3,6-tetrahydrophthalic anhydride represented by the following Chemical Formula 10, isobutenyl succinic anhydride represented by the following Chemical Formula 11, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

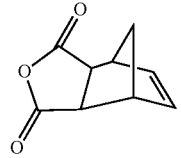

[Chemical Formula 9]

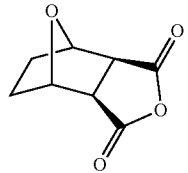

[Chemical Formula 10]

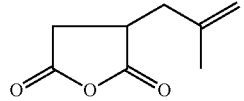

[Chemical Formula 11]

In addition, examples of the thermally polymerizable functional group at one or both ends of the polybenzoxazole precursor can include without limitation the following Chemical Formulae 12 to 16. These thermally polymerizable functional groups can be cross-linked during the heating process.

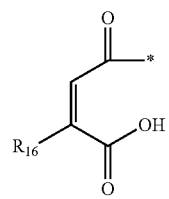

[Chemical Formula 12]

In Chemical Formula 12, $R_{16}$ is H, $CH_2COOH$, or $CH_2CHCHCH_3$.

[Chemical Formula 13]

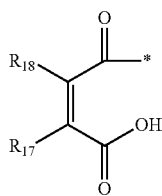

In Chemical Formula 13, $R_{17}$ and $R_{18}$ are the same or different and are independently H or $CH_3$.

[Chemical Formula 14]

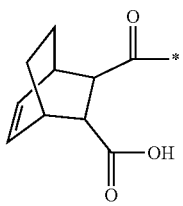

[Chemical Formula 15]

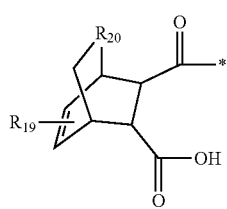

In Chemical Formula 15, $R_{19}$ is H or $CH_3$, and $R_{20}$ is $CH_2$ or an oxygen atom.

[Chemical Formula 16]

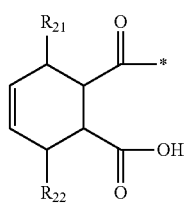

In Chemical Formula 16, $R_{21}$ and $R_{22}$ are the same or different and are independently H, $CH_3$, or $OCOCH_3$.

The polybenzoxazole precursor can have a weight average molecular weight (Mw) ranging from about 3000 to about 300,000. When the polybenzoxazole precursor has a weight average molecular weight within this range, sufficient physical properties and excellent solubility to the organic solvent may be provided.

The polyamic acid may include a repeating unit represented by the following Chemical Formulae 50 and 51. Since the polyamic acid includes a repeating unit represented by the following Chemical Formula 50, a resin may be rapidly cured during the curing at a high temperature. Since the polyamic acid includes a repeating unit represented by the following Chemical Formula 51, it may improve thermal characteristics during the curing at a high temperature.

[Chemical Formula 50]

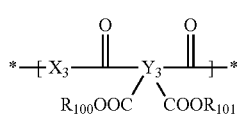

[Chemical Formula 51]

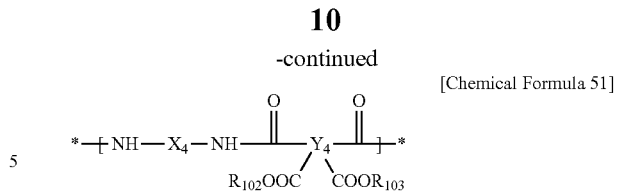

In Chemical Formulae 50 to 51, $X_3$ is an aromatic organic group or a divalent to hexavalent alicyclic organic group, $Y_3$ and $Y_4$ are the same or different and are independently an aromatic organic group or a quadrivalent to hexavalent alicyclic organic group, $X_4$ is an aromatic organic group, a divalent to hexavalent alicyclic organic group, or a functional group represented by Chemical Formula 3, and $R_{100}$ to $R_{103}$ are the same or different and are independently hydrogen or substituted or unsubstituted C1 to C20 alkyl.

In the positive photosensitive resin composition, when repeating units represented by the above Chemical Formulae 50 and 51 are 100 mol % in total, the repeating unit represented by the above Chemical Formula 50 may be included in an amount ranging from about 5 mol % to about 50 mol %, and the other repeating unit represented by the above Chemical Formula 51 may be included in an amount ranging from about 50 mol % to about 95 mol %.

In some embodiments, a repeating unit represented by the above Chemical Formula 50 may be included in an amount ranging from about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 mol % and a repeating unit represented by the above Chemical Formula 51 may be included in an amount ranging from about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 mol %. Further, according to some embodiments of the present invention, the amount of a repeating unit represented by the above Chemical Formula 50 and/or the above Chemical Formula 51 can be in a range from about any of the foregoing amounts to about any other of the foregoing amounts.

(B) Dissolution-Controlling Agent

In general, a phenol compound having a low molecular weight such as a resorcinol-based phenol and the like, which is used as a dissolution-controlling agent, may be easily influenced by the environment inside a coating protective layer. In other words, solubility of a phenol compound in a developing solution may be easily influenced by materials other than a low molecular material, and thus have greater dissolution deterioration against an acid generator than a polymer material. In addition, it may negatively influence the pattern, for example, form a pattern having a round cross-section.

In addition, an acid generator could be included in a high concentration to provide high sensitivity but this may also deteriorate development properties, which can limit the ability to achieve high sensitivity.

According to one embodiment of the present invention, a positive photosensitive resin composition may include a dissolution-controlling agent having a boiling point ranging from about 210° C. to about 400° C., and a polarity ranging from about 1 D to about 4 D. This dissolution-controlling agent can make it possible to form an excellent pattern and to increase sensitivity and resolution.

Since the dissolution-controlling agent has a somewhat higher boiling point than a solvent included in the positive photosensitive resin composition, it may not be volatilized with the solvent during the thermal curing and may remain. Accordingly, since the dissolution-controlling agent can wet a residue left in the positive photosensitive resin composition, it can effectively remove the residue. In addition, when the dissolution-controlling agent has a polarity ranging from 1 D to 4 D, it may mix well with residue of a positive photosensitive resin composition. The D is a unit of an electric dipole moment and indicates debye.

The dissolution-controlling agent may be a compound of Chemical Formula 17 or Chemical Formula 18, and can be used independently or with a resorcinol-based phenol compound.

The dissolution-controlling agent may play a role in removing development residue, since it increases wetness of an acid generator remaining in an exposed region and a compound (A) in a developing solution, when an exposed region is better dissolved due to an acid degradable functional group separated from an acid generator by an acid component generated from an onium salt-based compound or a photosensitive diazoquinone compound during exposure while dissolution of an unexposed region is suppressed. In addition, since it has a lower boiling point than a resorcinol compound, it can be removed at a curing temperature but may not damage reliability of a compound.

[Chemical Formula 17]

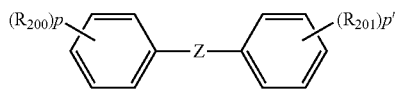

[Chemical Formula 18]

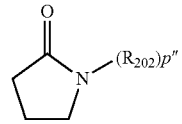

In Chemical Formulae 17 and 18, $R_{200}$ to $R_{202}$ are the same or different and are independently hydrogen, substituted or unsubstituted alkyl, or substituted or unsubstituted allyl, p, p', and p" are the same or different and are independently integers ranging from 1 to 4, and Z is O, CO, CONH, $CR_{203}R_{204}$, S, $SO_2$ or a single bond. As used herein, $R_{203}$ and $R_{204}$ are the same or different and are independently hydrogen or substituted or unsubstituted alkyl.

The dissolution-controlling agent may be included in an amount of about 0.1 to about 30 parts by weight, based on about 100 parts by weight of the resin precursor. In some embodiments, the dissolution-controlling agent may be included in an amount ranging from about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the dissolution-controlling agent can be in a range from about any of the foregoing amounts to about any other of the foregoing amounts. When the dissolution-controlling agent is included in an amount within this range, it may decrease residue and improve resolution.

(C) Acid Generator

Examples of the acid generator may include without limitation photosensitive diazoquinone compounds; onium salt-based compounds; sulfonate-based compounds; oxime-sulfonate-based compounds; diazomethane-based compounds such as bisalkylsulfonyldiazomethanes, bisarylsulfonyldiazomethanes, poly(bissulfonyl)diazomethanes, and the like; nitrobenzylsulfonate-based compounds; amino-sulfonate-based compounds; disulfone-based compounds; and the like, and combinations thereof.

Examples of the photosensitive diazoquinone compound may include without limitation a compound represented by the following Chemical Formulae 19 to 23.

[Chemical Formula 19]

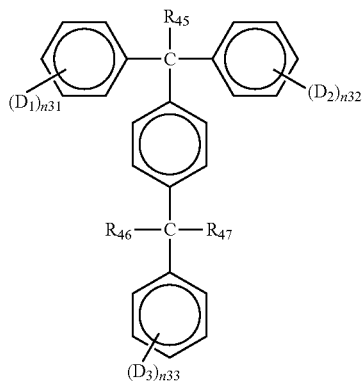

In Chemical Formula 19, $R_{45}$ to $R_{47}$ are the same or different and are independently hydrogen or substituted or unsubstituted alkyl, for example $CH_3$, $D_1$ to $D_3$ are independently OQ, wherein Q is hydrogen, the following Chemical Formula 20-1, or the following Chemical Formula 20-2, provided that all Q's are not simultaneously hydrogen, and $n_{31}$ to $n_{33}$ are the same or different and are independently an integer ranging from 1 to 3.

[Chemical Formula 20-1]

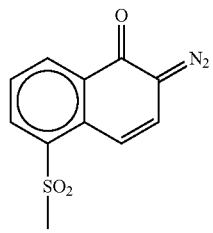

[Chemical Formula 20-2]

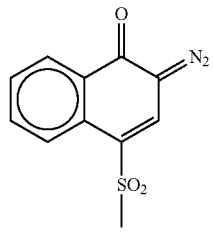

[Chemical Formula 21]

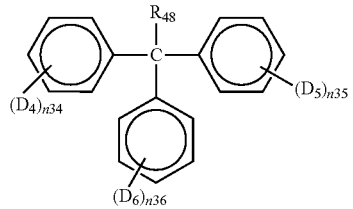

In Chemical Formula 21, $R_{48}$ is hydrogen or substituted or unsubstituted alkyl, $D_4$ to $D_6$ are independently OQ, wherein Q is the same as defined In Chemical Formula 19, and $n_{34}$ to $n_{36}$ are the same or different and are independently integers ranging from 1 to 3.

[Chemical Formula 22]

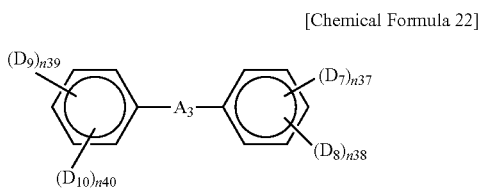

In Chemical Formula 22, $A_3$ can be CO or CRR', wherein R and R' are the same or different and are independently substituted or unsubstituted alkyl, $D_7$ to $D_{10}$ are the same or different and are independently hydrogen, substituted or unsubstituted alkyl, OQ, or NHQ, wherein Q is the same as defined in Chemical Formula 19, $n_{37}$, $n_{38}$, $n_{39}$, and $n_{40}$ are the same or different and are independently an integer ranging from 1 to 4, $n_{37}+n_{38}$ and $n_{39}+n_{40}$ are independently an integer of 5 or less, and at least one of $D_7$ to $D_8$ is OQ. The compound includes 1 to 3 OQ's at one aromatic ring and 1 to 4 OQ's at another aromatic ring.

[Chemical Formula 23]

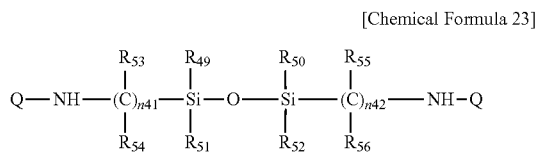

In Chemical Formula 23, $R_{49}$ to $R_{56}$ are the same or different and are independently hydrogen or substituted or unsubstituted alkyl, and $n_{41}$ and $n_{42}$ are the same or different and are independently an integer ranging from 1 to 5, for example from 2 to 4, and each Q is the same as defined in Chemical Formula 19.

The onium salt-based compound may include any compound including an alkylsulfonic acid as a negative ion. In addition, there is no particular limit to a positive ion included in an onium salt with an alkyl sulfonic acid negative ion. The positive ion may include a positive ion of an acid generator known in the art for a conventional chemically amplified resist composition. Examples of the acid generator may include sulfonium ions, iodine ions, and the like.

Examples of the onium salt-based compound may be represented by the following Chemical Formula 24.

[Chemical Formula 24]

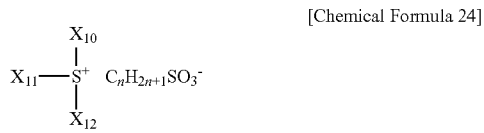

In Chemical Formula 24, $X_{10}$ to $X_{12}$ are the same or different and are independently substituted or unsubstituted aryl or substituted or unsubstituted alkyl, and n is an integer ranging from 1 to 10.

At least one of the $X_{10}$ to $X_{12}$ may be aryl, for example more than two of $X_{10}$ to $X_{12}$ may be aryl, and as another example all of $X_3$ to $X_5$ may be aryl, and as yet another example all of $X_3$ to $X_5$ may be phenyl.

There is no limitation to the type of aryl group. In exemplary embodiments, the aryl group may be a C6 to C20 aryl, for example a C6 to C10 aryl. In addition, when the aryl group is a substituted aryl group, examples of the substituent may include without limitation alkyl, halogen, and the like, and combinations thereof. Examples of an unsubstituted aryl group may include without limitation phenyl, naphthyl, and the like.

There is no limitation to the type of alkyl group. In exemplary embodiments, the alkyl group can be a C1 to C10 linear, branched, or cyclic alkyl group, for example a C1 to C5 alkyl group, which is good for resolution. Examples of the alkyl group may include without limitation methyl, ethyl, n-propyl, isopropyl, n-butyl, isobutyl, n-pentyl, cyclopentyl, hexyl, cyclohexyl, nonyl, decanyl, and the like. When the alkyl group is methyl, it may bring about excellent resolution with a low cost.

The n may be an integer ranging from 1 to 10, from 1 to 8, or from 4 to 8. When the n is an integer ranging from 4 or 8, it is easy to industrially synthesize.

The alkyl group represented by $CnH_{2n+1}$ may be linear or branched, and in exemplary embodiments may be linear alkyl. Examples of the linear alkyl group may include without limitation methyl, ethyl, n-propyl, n-butyl, n-pentyl, n-hexyl, n-heptyl, n-octyl, n-nonyl, n-decyl, and the like.

In addition, the onium salt-based compound can be used singularly or as a combination of two or more.

Examples of the sulfonate-based compound include without limitation diphenyliodonium trifluoromethanesulfonate or diphenyliodonium nonafluorobutanesulfonate; triphenylsulfonium trifluoromethanesulfonate, triphenylsulfonium heptafluoropropanesulfonate, or triphenylsulfonium nonafluorobutanesulfonate; dimethyl(4-hydroxynaphthyl)sulfonium trifluoromethanesulfonate, dimethyl(4-hydroxynaphthyl)sulfonium heptafluoropropanesulfonate, or dimethyl(4-hydroxynaphthyl)sulfonium nonafluorobutanesulfonate; monophenyldimethylsulfonium trifluoromethanesulfonate, monophenyldimethylsulfonium heptafluoropropanesulfonate, or monophenyldimethylsulfonium nonafluorobutanesulfonate; diphenylmonomethylsulfonium trifluoromethanesulfonate, diphenylmonomethylsulfonium heptafluoropropanesulfonate, or diphenylmonomethylsulfonium nonafluorobutanesulfonate; (4-methoxyphenyl)diphenylsulfonium trifluoromethanesulfonate, (4-methoxyphenyl) diphenylsulfonium heptafluoropropanesulfonate, or (4-methoxyphenyl)diphenylsulfonium nonafluorobutanesulfonate; and the like, and combinations thereof.

Examples of the oximesulfonate-based compound include without limitation α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzene sulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl] acetonitrile, α-(tosyloxyimino)-4-thienylcyaide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, α-(methylsulfonyloxyimino)-p-bromophenylacetonitrile, and the like, and combinations thereof. α-(Methylsulfonyloxyimino)-p-methoxyphenylacetonitrile may be used in exemplary embodiments.

Of the diazomethane-based compound, examples of bisalkyl or bisarylsulfonyldiazomethanes include without limitation bis(isopropylsulfonyl)diazomethane, bis(p-toluenesulfonyl)diazomethane, bis(1,1-dimethylethylsulfonyl)diazomethane, bis(cyclohexylsulfonyl)diazomethane, bis(2,4-dimethylphenylsulfonyl)diazomethane, and the like, and combinations thereof. Examples of the poly(bissulfonyl)diazomethane include without limitation 1,3-bis(phenylsulfonyldiazomethylsulfonyl)propane (with a decomposition temperature of 135° C.), 1,4-bis(phenylsulfonyldiazomethylsulfonyl)butane (with a decomposition temperature of 147° C.), 1,6-bis(phenylsulfonyldiazomethylsulfonyl)hexane (with a melting point of 132° C. and a decomposition temperature of 145° C.), 1,10-bis(phenylsulfonyldiazomethylsulfonyl)decane (with a decomposition temperature of 147° C.), 1,2-bis(cyclohexylsulfonyldiazomethylsulfonyl)ethane (with a decomposition temperature of 149° C.), 1,3-bis(cyclohexylsulfonyldiazomethylsulfonyl)propane (with a decomposition temperature of 153° C.), 1,6-bis(cyclohexylsulfonyldiazomethylsulfonyl)hexane (with a melting point of 109° C. and a decomposition temperature of 122° C.), 1,10-bis(cyclohexylsulfonyldiazomethylsulfonyl)decane (with a decomposition temperature of 116° C.), and the like, and combinations thereof.

Examples of the bisarylsulfonyldiazomethane may include without limitation a compound represented by the following Chemical Formula 30.

[Chemical Formula 30]

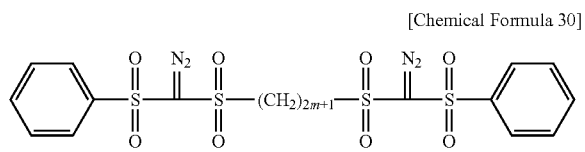

In Chemical Formula 30, m is an integer ranging from 2 to 6.

Other acid generators may be used singularly or as a combination of two or more.

The acid generator may be included in an amount of about 1 to about 50 parts by weight, based on about 100 parts by weight of a polybenzoxazole precursor. In one embodiment, the acid generator may be included in an amount of about 5 to about 30 parts by weight, based on about 100 parts by weight of a polybenzoxazole precursor. In some embodiments, the acid generator may be included in an amount ranging from about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 parts by weight. Further, according to some embodiments of the present invention, the amount of the acid generator can be in a range from about any of the foregoing amounts to about any other of the foregoing amounts. When the acid generator is included in an amount within these ranges, it can effectively separate an acid degradable functional group protecting a phenol hydroxyl group of a polyphenol compound by light. There may be also a decrease in residue (scum) and improved resolution.

The acid degradable functional group may include a linear tertiary alkyl group, a tertiary alkyl group including an alicyclic group, a linear alkoxy alkyl group, a tertiary alkyloxycarbonyl group, a tertiary alkoxycarbonyl alkyl group, a cyclic ether, an amyloxycarbonyl, an amyloxycarbonyl alkyl, an acetal group, or a combination thereof.

(D) Silane Compound

The silane-based compound can improve adhesion of a photosensitive resin composition to a substrate.

The silane-based compound may be represented by the following Chemical Formula 25.

[Chemical Formula 25]

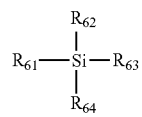

In Chemical Formula 25, $R_{61}$ is a vinyl group, substituted or unsubstituted alkyl, or substituted or unsubstituted aryl, for example 3-(metha)acryloxypropyl, p-styryl, or 3-(phenylamino)propyl, and $R_{62}$ to $R_{64}$ are the same or different and are independently substituted or unsubstituted alkoxy, for example a C1 to C8 alkoxy, substituted or unsubstituted alkyl, for example C1 to C20 alkyl, or halogen, wherein at least one of $R_{62}$ to $R_{64}$ may be alkoxy or halogen.

Examples of the silane-based compound may include without limitation a compound represented by the following Chemical Formulae 26 and 27; a silane compound including an aryl group such as trimethoxy[3-(phenylamino)propyl]silane and the like; a silane compound including a carbon-carbon unsaturated bond such as vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyldiethoxysilane, and the like, and combinations thereof. In exemplary embodiments, the silane-based compound can be vinyltrimethoxysilane or vinyltriethoxysilane.

[Chemical Formula 26]

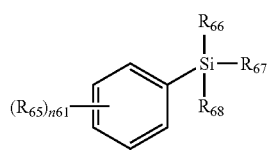

In Chemical Formula 26, $R_{65}$ is $NH_2$ or $CH_3CONH$, and $R_{66}$ to $R_{68}$ are the same or different and are independently substituted or unsubstituted alkoxy, for example $OCH_3$ or $OCH_2CH_3$, and $n_{61}$ is an integer ranging from 1 to 5.

[Chemical Formula 27]

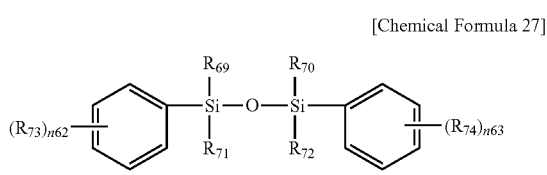

In Chemical Formula 27, $R_{69}$ to $R_{72}$ are the same or different and are independently substituted or unsubstituted alkyl or substituted or unsubstituted alkoxy, for example $CH_3$ or $OCH_3$, $R_{73}$ and $R_{74}$ are the same or different and are independently substituted or unsubstituted amino, for example $NH_2$ or $CH_3CONH$, and $n_{62}$ and $n_{63}$ are the same or different and are independently an integer ranging from 1 to 5.

The silane-based compound may be included in an amount of about 0.1 to about 30 parts by weight, based on about 100 parts by weight of the resin precursor. In some embodiments, the silane-based compound may be included in an amount ranging from about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane-based compound can be in a range from about any of the foregoing amounts to about any other of the foregoing amounts.

When the silane-based compound is included in an amount within this range, a resulting resin composition can have excellent adherence to upper and lower layers and have minimal or no residual film after development, and can improve mechanical properties of a layer such as optical characteristic (transmittance), tensile strength, elongation, Young's modulus, and the like.

(E) Solvent

The solvent may include an organic solvent, such as but not limited to N-methyl-2-pyrrolidone, gamma-butyrolactone, N,N-dimethyl acetamide, dimethylsulfoxide, diethyleneglycoldimethylether, diethyleneglycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like, and combinations thereof. The solvent may be used singularly or in combination.

The solvent may be included in an amount of about 100 to about 400 parts by weight, based on about 100 parts by weight of a polybenzoxazole precursor. In some embodiments, the solvent may be included in an amount ranging from about 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, or 400 parts by weight. Further, according to some embodiments of the present invention, the amount of the solvent can be in a range from about any of the foregoing amounts to about any other of the foregoing amounts.

When the solvent is included in an amount within this range, the composition maybe coated onto a substrate to form a sufficiently thick layer, and the composition can have excellent solubility and coating properties.

(F) Other Additives

According to one embodiment of the present invention, a positive photosensitive resin composition may further include one more (F) additives other than the aforementioned (A) to (E) components.

The other additives may include a thermal latent acid generator. Examples of the thermal latent acid generator may include without limitation an arylsulfonic acid such as p-toluene sulfonic acid and benzenesulfonic acid; a perfluoro alkyl sulfonic acid such as trifluoromethanesulfonic acid and fluorinebutanesulfonic acid; an alkyl sulfonic acid such as methane sulfonic acid, ethane sulfonic acid, and butane sulfonic acid; and the like, and combinations thereof.

The thermal latent acid generator is a catalyst for dehydration and cyclization reactions and has a polyamide structure including the phenolic hydroxyl group of a polybenzoxazole precursor and promotes a cyclization reaction despite lowering curing temperature.

In addition, a surfactant or a leveling agent may be included to prevent the layer thickness from being stained and to improve development.

According to another embodiment of the present invention, provided is a method of forming a pattern using a positive photosensitive resin composition that includes coating a positive photosensitive resin composition on a supporting substrate, drying the coated composition, exposing the layer to light, developing the exposed layer in an alkali aqueous solution to prepare a photosensitive resin layer, and heating the photosensitive resin layer. The processes of coating a photosensitive resin composition, exposing it to light, and developing it to form a pattern are well-known in the art and are not illustrated in detail in this specification.

Another embodiment of the present invention provides a photosensitive resin layer prepared using a positive photosensitive resin composition. Examples of the photosensitive resin layer may include an insulation layer or a protective layer.

Still another embodiment of the present invention provides a semiconductor device including the aforementioned photosensitive resin layer prepared using the aforementioned positive photosensitive resin composition. The aforementioned positive photosensitive resin composition can be used in an insulation layer, a passivation layer, or a buffer coating layer in a semiconductor device. In other words, the positive photosensitive resin composition can be applied to a surface protective layer and an interlayer insulating layer of a semiconductor device.

Hereinafter, the present invention will be further illustrated in more detail referring to examples. However, these are exemplary embodiments, and the present invention is not limited thereto.

Synthesis Example 1

Synthesis of Polybenzoxazole Precursor (PBO-1)

18.3 g of 2,2-bis(3-amino-4-hydroxyphenyl)-1,1,1,3,3,3-hexafluoropropane is placed in a four-neck flask having an agitator, a temperature controller, a nitrogen gas injector, and a cooler, while nitrogen is passed through the flask. Then, 280 g of N-methyl-2-pyrrolidone (NMP) is added thereto to dissolve it to prepare a first solution. The first solution includes a solid in an amount of 9 wt %.

When the solid is completely dissolved, 9.9 g of pyridine is added to the solution. Another solution is prepared by dissolving 14.8 g of 4,4'-oxydibenzoyl chloride in 142 g of N-methyl-2-pyrrolidone (NMP) and then is slowly added to the first solution in a dropwise fashion for 30 minutes while maintaining a temperature ranging from 0 to 5° C. Then, the resulting mixture is reacted at a temperature ranging from 0 to 5° C. for 1 hour, and then heated to room temperature and agitated for one hour, completing the reaction. The reactant mixture is placed in a mixed solvent of water and methanol in a volume ratio of 10/1 to generate a precipitate. The precipitate is filtrated, sufficiently cleaned with water, and dried at 80° C. under vacuum for 24 hours, preparing a polybenzoxazole precursor (PBO-1).

Synthesis Example 2

Synthesis of a Polybenzoxazole Precursor (PBO-2)

17.4 g of 2,2-bis(3-amino-4-hydroxyphenyl)-1,1,1,3,3,3-hexafluoropropane and 0.86 g of 1,3-bis(aminopropyl)tetramethyldisiloxane are placed in a four-neck flask having an agitator, a temperature controller, a nitrogen gas injector, and a cooler, while nitrogen is passed through the flask. Then, 280 g of N-methyl-2-pyrrolidone (NMP) is added thereto to dissolve them and prepare a first solution. The first solution includes a solid in an amount of 9 wt %.

When the solid is completely dissolved, 9.9 g of pyridine is added to the above solution. Then, another solution is prepared by adding 14.8 g of 4,4'-oxydibenzoyl chloride to 142 g of N-methyl-2-pyrrolidone (NMP), and it is slowly added to the first solution in a dropwise fashion for 30 minutes while maintaining a temperature ranging from 0 to 5° C. The resulting mixture is reacted for 1 hour at a temperature ranging from 0 to 5° C., heated to room temperature, and then agitated for one hour, completing the reaction. The resulting mixture is placed in a solvent of water and methanol in a volume ratio of 10:1 to produce a precipitate. The precipitate is filtrated, sufficiently cleaned with water, and dried at 80° C. under vacuum for 24 hours, preparing a polybenzoxazole precursor (PBO-2). The prepared polybenzoxazole precursor is measured using $^1$H-NMR. The result is provided in FIG. 1.

Synthesis Example 3

Synthesis of Polybenzoxazole Precursor (PBO-3)

17.4 g of 2,2-bis(3-amino-4-hydroxyphenyl)-1,1,1,3,3,3-hexafluoropropane and 0.86 g of 1,3-bis(aminopropyl)tetramethyldisiloxane are placed in a four-neck flask having an agitator, a temperature controller, a nitrogen gas injector, and a cooler, while nitrogen is passed through the flask. Then, 280 g of N-methyl-2-pyrrolidone (NMP) is added thereto to dissolve them to prepare a first solution. The first solution includes a solid in an amount of 9 wt %.

When the solid is completely dissolved, 9.9 g of pyridine is added thereto. The resulting mixture is maintained at a temperature ranging from 0 to 5° C. Another solution is prepared by adding 13.3 g of 4,4'-oxydibenzoyl chloride to 142 g of N-methyl-2-pyrrolidone (NMP). This solution is slowly added to the first solution for 30 minutes in a dropwise fashion. Then, the resulting mixture is reacted for 1 hour at a temperature ranging from 0 to 5° C., heated to room temperature, and reacted for one hour.

The reaction is complete after 1.6 g of 5-norbornene-2,3-dicarboxyl anhydride is added to the above mixture and agitated at room temperature for 2 hours. The resulting mixture is added to a solution of water and methanol in a volume ratio of 10/1 to produce a precipitate. The precipitate is filtrated, sufficiently washed with water, and vacuum-dried at 80° C. for 24 hours, preparing a polybenzoxazole precursor (PBO-3).

Synthesis Example 4

Synthesis of Polybenzoxazole Precursor (PBO-4)

A polybenzoxazole precursor (PBO-4) is prepared according to the same method as Synthesis Example 3, except for using maleic anhydride instead of 5-norbornene-2,3-dicarboxyl anhydride.

Synthesis Example 5

Synthesis of a Polybenzoxazole Precursor (PBO-5)

A polybenzoxazole precursor (PBO-5) is prepared according to the same method as Synthesis Example 3, except for using aconitic anhydride instead of 5-norbornene-2,3-dicarboxyl anhydride.

Synthesis Example 6

Synthesis of a Polybenzoxazole Precursor (PBO-6)

A polybenzoxazole precursor (PBO-6) is prepared according to the same method as Synthesis Example 3, except for using isobutenylsuccinic anhydride instead of 5-norbornene-2,3-dicarboxyl anhydride.

Synthesis Example 7

Synthesis of Polybenzoxazole Precursor (PBO-7)

A polybenzoxazole precursor (PBO-7) is prepared according to the same method as Synthesis Example 3, except for using 3,6-epoxy-1,2,3,6-tetrahydrophthalic anhydride instead of 5-norbornene-2,3-dicarboxyl anhydride.

Example 1

A positive photosensitive resin composition is prepared by dissolving 15 g of the polybenzoxazole precursor (PBO-3) according to Synthesis Example 3 in 35.0 of γ-butyrolactone, and 0.75 g of diphenyl ether, 3 g of photosensitive diazoquinone represented by Chemical Formula 19a, and 0.75 g of trimethoxy[3-(phenylamino)propyl]silane represented by the following Chemical Formula 25a are added thereto and dissolved therein. The resulting mixture is filtrated with a 0.45 μm fluorine resin filter.

[Chemical Formula 19a]

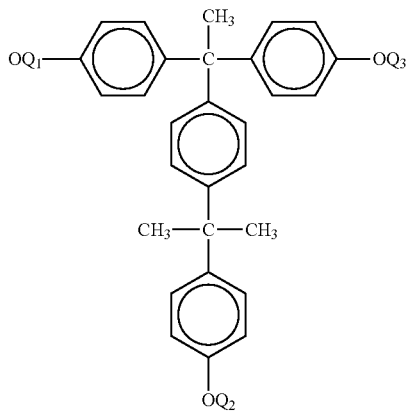

In Chemical Formula 19a, two out of $Q_1$, $Q_2$, and $Q_3$ are substituted with the following Chemical Formula 19a-1, and the other is hydrogen.

[Chemical Formula 19a-1]

[Chemical Formula 25a]

Example 2

A positive photosensitive resin composition is prepared according to Example 1, except for using 0.75 g of cyclohexyl pyrrolidone instead of 0.75 g of diphenyl ether.

Example 3

A positive photosensitive resin composition is prepared according to Example 1, except for using 0.75 g of a mixture of hydroxy phenol and diphenyl ether mixed in a weight ratio of 6:1 instead of 0.75 g of the diphenyl ether.

Example 4

A positive photosensitive resin composition is prepared according to Example 1, except for using 0.75 g of a mixture of hydroxy phenol and cyclohexyl pyrrolidone mixed in a weight ratio of 6:1 instead of 0.75 g of the diphenyl ether.

Example 5

A positive photosensitive resin composition is prepared according to Example 1, except for using the polybenzoxazole precursor (PBO-4) according to Synthesis Example 4 instead of 15 g of the polybenzoxazole precursor (PBO-3) according to Synthesis Example 3.

Example 6

A positive photosensitive resin composition is prepared according to the same method as Example 1, except for using a polybenzoxazole precursor (PBO-4) of Synthesis Example 4 instead of 15 g of the polybenzoxazole precursor (PBO-3) of Synthesis Example 3 and 0.75 g of cyclohexyl pyrrolidone instead of 0.75 g of the diphenyl ether.

Example 7

A positive photosensitive resin composition is prepared according to the same method as Example 1, except for using a polybenzoxazole precursor (PBO-4) of Synthesis Example 4 instead of 15 g of the polybenzoxazole precursor (PBO-3) of Synthesis Example 3 and 0.75 g of a mixture of hydroxy phenol and diphenyl ether mixed in a weight ratio of 6:1 instead of 0.75 g of the diphenyl ether.

Example 8

A positive photosensitive resin composition is prepared according to the same method as Example 1, except for using a polybenzoxazole precursor (PBO-4) of Synthesis Example 4 instead of 15 g of the polybenzoxazole precursor (PBO-3) of Synthesis Example 3 and 0.75 g of a mixture of hydroxy phenol and cyclohexyl pyrrolidone mixed in a weight ratio of 6:1 instead of 0.75 g of the diphenyl ether.

Example 9

A positive photosensitive resin composition is prepared according to the same method as Example 1, except for using a polybenzoxazole precursor (PBO-5) of Synthesis Example 5 instead of 15 g of the polybenzoxazole precursor (PBO-3) of Synthesis Example 3.

Example 10

A positive photosensitive resin composition is prepared according to the same method as Example 1, except for using a polybenzoxazole precursor (PBO-5) of Synthesis Example 5 instead of 15 g of the polybenzoxazole precursor (PBO-3) of Synthesis Example 3 and 0.75 g of cyclohexyl pyrrolidone instead of 0.75 g of the diphenyl ether.

Example 11

A positive photosensitive resin composition is prepared according to the same method as Example 1, except for using a polybenzoxazole precursor (PBO-5) of Synthesis Example 5 instead of 15 g of the polybenzoxazole precursor (PBO-3) of Synthesis Example 3 and 0.75 g of a mixture of hydroxy phenol and diphenyl ether mixed in a weight ratio of 6:1 instead of 0.75 g of the diphenyl ether.

Example 12

A positive photosensitive resin composition is prepared according to the same method as Example 1, except for using a polybenzoxazole precursor (PBO-5) of Synthesis Example 5 instead of 15 g of the polybenzoxazole precursor (PBO-3) of Synthesis Example 3 and 0.75 g of a mixture of hydroxy phenol and cyclohexyl pyrrolidone mixed in a weight ratio of 6:1 instead of 0.75 g of the diphenyl ether.

Example 13

A positive photosensitive resin composition is prepared according to the same method as Example 1, except for using a polybenzoxazole precursor (PBO-6) of Synthesis Example 6 instead of 15 g of the polybenzoxazole precursor (PBO-3) of Synthesis Example 3.

Example 14

A positive photosensitive resin composition is prepared according to the same method as Example 1, except for using a polybenzoxazole precursor (PBO-6) of Synthesis Example 6 instead of 15 g of the polybenzoxazole precursor (PBO-3) of Synthesis Example 3 and 0.75 g of a mixture of hydroxy phenol and cyclohexyl pyrrolidone mixed in a weight ratio of 6:1 instead of 0.75 g of the diphenyl ether.

Example 15

A positive photosensitive resin composition is prepared according to the same method as Example 1, except for using a polybenzoxazole precursor (PBO-6) of Synthesis Example 6 instead of 15 g of the polybenzoxazole precursor (PBO-3) of Synthesis Example 3 and 0.75 g of a mixture of hydroxy phenol and diphenyl ether mixed in a weight ratio of 6:1 instead of 0.75 g of the diphenyl ether.

Example 16

A positive photosensitive resin composition is prepared according to the same method as Example 1, except for using a polybenzoxazole precursor (PBO-6) of Synthesis Example 6 instead of 15 g of the polybenzoxazole precursor (PBO-3) of Synthesis Example 3 and 0.75 g of a mixture of hydroxy phenol and cyclohexyl pyrrolidone mixed in a weight ratio of 6:1 instead of 0.75 g of the diphenyl ether.

Example 17

A positive photosensitive resin composition is prepared according to the same method as Example 1, except for using a polybenzoxazole precursor (PBO-7) of Synthesis Example 7 instead of 15 g of the polybenzoxazole precursor (PBO-3) of Synthesis Example 3.

Example 18

A positive photosensitive resin composition is prepared according to the same method as Example 1, except for using a polybenzoxazole precursor (PBO-7) of Synthesis of Example 7 instead of 15 g of the polybenzoxazole precursor (PBO-3) of Synthesis Example 3 and 0.75 g of a mixture of hydroxy phenol and cyclohexyl pyrrolidone mixed in a weight ratio of 6:1 instead of 0.75 g of the diphenyl ether.

Example 19

A positive photosensitive resin composition is prepared according to the same method as Example 1, except for using a polybenzoxazole precursor (PBO-7) of Synthesis Example 7 instead of 15 g of the polybenzoxazole precursor (PBO-3) of Synthesis Example 3 and 0.75 g of a mixture of hydroxy phenol and diphenyl ether mixed in a weight ratio of 6:1 instead of 0.75 g of the diphenyl ether.

Example 20

A positive photosensitive resin composition is prepared according to the same method as Example 1, except for using a polybenzoxazole precursor (PBO-7) of Synthesis Example 7 instead of 15 g of the polybenzoxazole precursor (PBO-3) of Synthesis Example 3 and 0.75 g of a mixture of hydroxy phenol and cyclohexyl pyrrolidone mixed in a weight ratio of 6:1 instead of 0.75 g of the diphenyl ether.

Comparative Example 1

A positive photosensitive resin composition is prepared according to the same method as Example 1, except for using a polybenzoxazole precursor (PBO-1) of Synthesis Example 1 instead of 15 g of the polybenzoxazole precursor (PBO-3) of Synthesis Example 3 and 0.75 g of N-methylpyrrolidone (NMP) instead of 0.75 g of the diphenyl ether.

Comparative Example 2

A positive photosensitive resin composition is prepared according to the same method as Example 1, except for using a polybenzoxazole precursor (PBO-1) of Synthesis Example 1 instead of 15 g of the polybenzoxazole precursor (PBO-3) of Synthesis Example 3 and 0.75 g of hydroxyphenol instead of 0.75 g of the diphenyl ether.

Comparative Example 3

A positive photosensitive resin composition is prepared according to the same method as Example 1, except for using a polybenzoxazole precursor (PBO-1) of Synthesis Example 1 instead of 15 g of the polybenzoxazole precursor (PBO-3) of Synthesis Example 3 and 0.75 g of diphenyl iodonium nitrate (DPIN) instead of 0.75 g of the diphenyl ether.

Comparative Example 4

A positive photosensitive resin composition is prepared according to the same method as Example 1, except for using a polybenzoxazole precursor (PBO-2) of Synthesis Example 2 instead of 15 g of the polybenzoxazole precursor (PBO-3) of Synthesis Example 3 and 0.75 g of N-methylpyrrolidone (NMP) instead of 0.75 g of the diphenyl ether.

Comparative Example 5

A positive photosensitive resin composition is prepared according to the same method as Example 1, except for using a polybenzoxazole precursor (PBO-2) of Synthesis Example 2 instead of 15 g of the polybenzoxazole precursor (PBO-3) of Synthesis Example 3 and 0.75 g of hydroxyphenol instead of 0.75 g of the diphenyl ether.

Comparative Example 6

A positive photosensitive resin composition is prepared according to the same method as Example 1, except for using a polybenzoxazole precursor (PBO-1) of Synthesis Example 1 instead of 15 g of the polybenzoxazole precursor (PBO-3) of Synthesis Example 3 and 0.75 g of diphenyl iodonium nitrate (DPIN) instead of 0.75 g of the diphenyl ether.

Comparative Example 7

A positive photosensitive resin composition is prepared according to the same method as Example 1, except for using 0.75 g of N-methylpyrrolidone (NMP) instead of 0.75 g of the diphenyl ether.

Comparative Example 8

A positive photosensitive resin composition is prepared according to the same method as Example 1, except for using 0.75 g of hydroxyphenol instead of 0.75 g of the diphenyl ether.

Comparative Example 9

A positive photosensitive resin composition is prepared according to the same method as Example 1, except for using 0.75 g of diphenyl iodonium nitrate (DPIN) instead of 0.75 g of the diphenyl ether.

Comparative Example 10

A positive photosensitive resin composition is prepared according to the same method as Example 1, except for using a polybenzoxazole precursor (PBO-4) of Synthesis Example 4 instead of 15 g of the polybenzoxazole precursor (PBO-3) of Synthesis Example 3 and 0.75 g of N-methylpyrrolidone (NMP) instead of 0.75 g of the diphenyl ether.

Comparative Example 11

A positive photosensitive resin composition is prepared according to the same method as Example 1, except for using a polybenzoxazole precursor (PBO-4) of Synthesis Example 4 instead of 15 g of the polybenzoxazole precursor (PBO-3) of Synthesis Example 3 and 0.75 g of hydroxyphenol instead of 0.75 g of the diphenyl ether.

Comparative Example 12

A positive photosensitive resin composition is prepared according to the same method as Example 1, except for using a polybenzoxazole precursor (PBO-4) of Synthesis Example 4 instead of 15 g of the polybenzoxazole precursor (PBO-3) of Synthesis Example 3 and 0.75 g of diphenyl iodonium nitrate (DPIN) instead of 0.75 g of the diphenyl ether.

The following Table 1 shows the photosensitive resin compositions according to Synthesis Examples 1 to 5 and a dissolution-controlling agent.

TABLE 1

| | Polybenzoxazole precursor | | | |
| --- | --- | --- | --- | --- |
| | Resin | End-capping monomer | Siloxane diamine | Dissolution-controlling agent |
| Example 1<br>Example 2<br>Example 3<br>Example 4 | PBO-3 | (norbornene dicarboxylic acid monoester structure) | Yes | diphenyl ether<br>cyclohexyl pyrrolidone<br>diphenyl ether + hydroxyphenol<br>cyclohexyl pyrrolidone + hydroxyphenol |
| Example 5<br>Example 6<br>Example 7<br>Example 8 | PBO-4 | (maleic acid monoester structure) | Yes | diphenyl ether<br>cyclohexyl pyrrolidone<br>diphenyl ether + hydroxyphenol<br>cyclohexyl pyrrolidone + hydroxyphenol |
| Example 9<br>Example 10<br>Example 11<br>Example 12 | PBO-5 | (itaconic/citraconic diacid structure) | Yes | diphenyl ether<br>cyclohexyl pyrrolidone<br>diphenyl ether + hydroxyphenol<br>cyclohexyl pyrrolidone + hydroxyphenol |
| Example 13<br>Example 14<br>Example 15<br>Example 16 | PBO-6 | (methylene-substituted structure) | Yes | diphenyl ether<br>cyclohexyl pyrrolidone<br>diphenyl ether + hydroxyphenol<br>cyclohexyl pyrrolidone + hydroxyphenol |

TABLE 1-continued

| | Polybenzoxazole precursor | | | |
| --- | --- | --- | --- | --- |
| | Resin | End-capping monomer | Siloxane diamine | Dissolution-controlling agent |
| Example 17<br>Example 18<br>Example 19<br>Example 20 | PBO-7 | 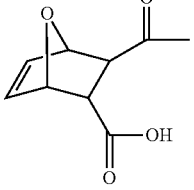 | Yes | diphenyl ether<br>cyclohexyl pyrrolidone<br>diphenyl ether + hydroxyphenol<br>cyclohexyl pyrrolidone + hydroxyphenol |
| Comparative Example 1 | PBO-1 | No | Yes | NMP |
| Comparative Example 2 | | | | hydroxyphenol |
| Comparative Example 3 | | | | DPIN |
| Comparative Example 4 | PBO-2 | No | Yes | NMP |
| Comparative Example 5 | | | | hydroxyphenol |
| Comparative Example 6 | | | | DPIN |
| Comparative Example 7<br>Comparative Example 8<br>Comparative Example 9 | PBO-3 | 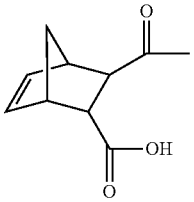 | Yes | NMP<br>hydroxyphenol<br>DPIN |
| Comparative Example 10<br>Comparative Example 11<br>Comparative Example 12 | PBO-4 | 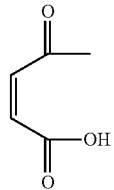 | Yes | NMP<br>hydroxyphenol<br>DPIN |
| Comparative Example 13<br>Comparative Example 14<br>Comparative Example 15 | PBO-5 | 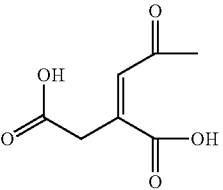 | Yes | NMP<br>hydroxyphenol<br>DPIN |
| Comparative Example 16<br>Comparative Example 17<br>Comparative Example 18 | PBO-6 | 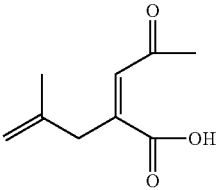 | Yes | NMP<br>hydroxyphenol<br>DPIN |

TABLE 1-continued

| | Polybenzoxazole precursor | | | |
|---|---|---|---|---|
| | Resin | End-capping monomer | Siloxane diamine | Dissolution-controlling agent |
| Comparative Example 19 | PBO-7 | (structure shown) | Yes | NMP |
| Comparative Example 20 | | | | hydroxyphenol |
| Comparative Example 21 | | | | DPIN |

† indicates text missing or illegible when filed.

Property Evaluation

The photosensitive resin compositions according to Examples 1 to 20 and Comparative Examples 1 to 21 are coated on an 8-inch wafer with a spin-coater (1H-DX2) made by Mikasa Co. and heated at 120° C. for 4 minutes on a hot plate, fabricating a photosensitive polyimide precursor film.

The polyimide precursor film is exposed to light at 250 ms with an I-line stepper (NSR i10C) using a variously-sized and patterned mask (Japanese Nikon Co.). The exposed part is removed at room temperature in a 2.38 wt % tetramethylammonium hydroxide aqueous solution for 60 seconds through 2 puddles and washed with pure water for 30 minutes. Next, the acquired pattern is cured in an electric furnace at 150° C./30 minutes and additionally at 320° C./30 minutes under an oxygen concentration of 1000 ppm or less.

The resolution of the pattern of the complete film is evaluated with an optical microscope. The film thickness change after preheat treatment, development, and curing is measured using a device (ST4000-DLX) made by KMAC Co. The results are provided in the following Table 2.

In addition, since film thickness decrease after the development may have an influence on the developing property and final film thickness, a film should have the least possible thickness decrease during the development. The film thickness change is measured by dipping a preheated film in a 2.38 wt % tetramethylammoniumhydroxide (TMAH) aqueous solution, and washing it hourly, and measuring hourly. The residual film rate (thickness after development/thickness before the development, unit %) is calculated and is provided in the following Table 2.

The sensitivity is evaluated by calculating exposure time for forming a 1:1 line width of a 10 μm L/S pattern after the exposure and development as an optimal exposure time. The resolution is evaluated by measuring a minimum pattern dimension during the optimal exposure time.

The film is heat-treated at 120° C. for 30 minutes under a nitrogen atmosphere, increased to 320° C. for 1 hour, and heated again at 320° C. for 1 hour for curing.

Figure 2:
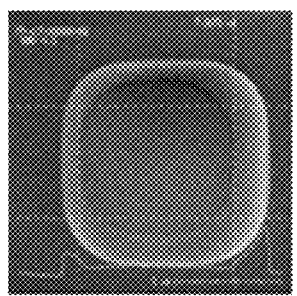
FIG. 2 includes photographs illustrating different degrees of residue generation (1 to 3) such as reported in Table 2.
Figure 2:
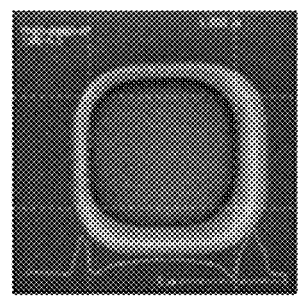
Figure 2:
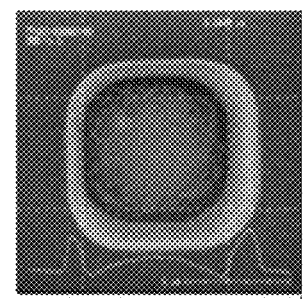
Figure 2:
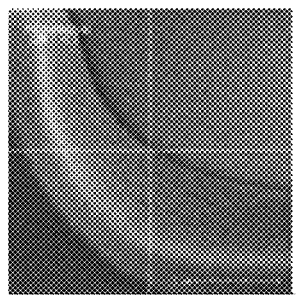
Figure 2:
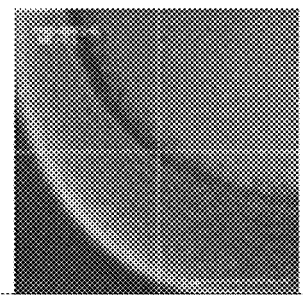
Figure 2:
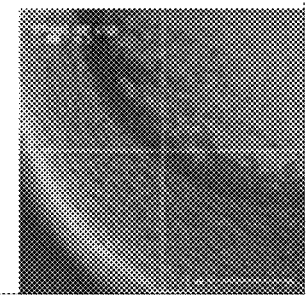

Furthermore, sensitivity and residue (scum)-generating degrees are measured. The results are provided in Table 2. In Table 2, 1 indicates no residue, 2 indicate a little residue, and 3 indicates much residue. FIG. 2 shows each residue-generating case.

TABLE 2

| | Polybenzoxazole precursor | Dissolution-controlling agent | Sensitivity (mJ/cm$^2$) | Residual film rate (%) | Residue-generating degrees |
|---|---|---|---|---|---|
| Example 1 | PBO-3 | diphenyl ether | 1000 | 92 | 1 |
| Example 2 | | diphenyl ether | 900 | 87 | 1 |
| Example 3 | | diphenyl ether + hydroxyphenol | 700 | 88 | 1 |
| Example 4 | | cyclohexyl pyrrolidone + hydroxyphenol | 600 | 85 | 1 |
| Example 5 | PBO-4 | diphenyl ether | 950 | 89 | 1 |
| Example 6 | | cyclohexyl pyrrolidone | 800 | 84 | 1 |
| Example 7 | | diphenyl ether + hydroxyphenol | 700 | 86 | 1 |
| Example 8 | | cyclohexyl pyrrolidone + hydroxyphenol | 500 | 80 | 1 |
| Example 9 | PBO-5 | diphenyl ether | 1000 | 89 | 1 |
| Example 10 | | cyclohexyl pyrrolidone | 750 | 85 | 1 |
| Example 11 | | diphenyl ether + hydroxyphenol | 600 | 86 | 1 |
| Example 12 | | cyclohexyl pyrrolidone + hydroxyphenol | 500 | 82 | 1 |
| Example 13 | PBO-6 | diphenyl ether | 850 | 88 | 1 |

TABLE 2-continued

| | Polybenzoxazole precursor | Dissolution-controlling agent | Sensitivity (mJ/cm$^2$) | Residual film rate (%) | Residue-generating degrees |
|---|---|---|---|---|---|
| Example 14 | | cyclohexyl pyrrolidone | 400 | 80 | 1 |
| Example 15 | | diphenyl ether + hydroxyphenol | 650 | 86 | 1 |
| Example 16 | | cyclohexyl pyrrolidone + hydroxyphenol | 400 | 79 | 1 |
| Example 17 | PBO-7 | diphenyl ether | 1100 | 91 | 1 |
| Example 18 | | cyclohexyl pyrrolidone | 600 | 82 | 1 |
| Example 19 | | diphenyl ether + hydroxyphenol | 750 | 86 | 1 |
| Example 20 | | cyclohexyl pyrrolidone + hydroxyphenol | 500 | 76 | 1 |
| Comparative Example 1 | PBO-1 | NMP | 900 | 83 | 3 |
| Comparative Example 2 | | hydroxyphenol | 1100 | 85 | 2 |
| Comparative Example 3 | | DPIN | 1300 | 90 | 3 |
| Comparative Example 4 | PBO-2 | NMP | 800 | 80 | 3 |
| Comparative Example 5 | | hydroxyphenol | 750 | 79 | 2 |
| Comparative Example 6 | | DPIN | 1100 | 86 | 3 |
| Comparative Example 7 | PBO-3 | NMP | 1150 | 88 | 3 |
| Comparative Example 8 | | hydroxyphenol | 1000 | 84 | 2 |
| Comparative Example 9 | | DPIN | 1400 | 91 | 3 |
| Comparative Example 10 | PBO-4 | NMP | 1000 | 86 | 3 |
| Comparative Example 11 | | hydroxyphenol | 900 | 85 | 2 |
| Comparative Example 12 | | DPIN | 1250 | 91 | 3 |
| Comparative Example 13 | PBO-5 | NMP | 900 | 84 | 3 |
| Comparative Example 14 | | hydroxyphenol | 900 | 83 | 2 |
| Comparative Example 15 | | DPIN | 1200 | 90 | 3 |
| Comparative Example 16 | PBO-6 | NMP | 800 | 80 | 3 |
| Comparative Example 17 | | hydroxyphenol | 900 | 86 | 2 |
| Comparative Example 18 | | DPIN | 1100 | 89 | 3 |
| Comparative Example 19 | PBO-7 | NMP | 850 | 84 | 3 |
| Comparative Example 20 | | hydroxyphenol | 1050 | 85 | 2 |
| Comparative Example 21 | | DPIN | 1450 | 92 | 3 |

As shown in Table 2, the dissolution-controlling agent used in the examples sharply reduces residue compared with the controlling agent of the comparative examples. Since an acid generator and a polybenzoxazole derivative in the exposed region have increased miscibility with a dissolution-controlling agent of the examples due to appropriate polarity during development in an alkali aqueous solution, a film could be easily removed, forming a better pattern. In addition, sensitivity and residual film rate vary depending on the kinds of dissolution-controlling agent. However, Examples 1 to 4 and Comparative Examples 7 to 9 including the same polybenzoxazole derivative represented by Chemical Formula 17 or 18 have decreased exposure and increased residual film rate and thus had better patterns.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition comprising:
(A) a resin precursor comprising a polybenzoxazole precursor, a polyamic acid, or a combination thereof;
(B) about 0.1 to about 20 parts by weight of a dissolution-controlling agent having a boiling point ranging from 210° C. to about 400° C. and a polarity ranging from about 1 D to about 4 D;
(C) about 1 to about 50 parts by weight of an acid generator;
(D) about 0.1 to about 30 parts by weight of a silane-based compound; and
(E) about 100 to about 400 parts by weight of a solvent, based on about 100 parts by weight of the resin precursor (A),
wherein the polybenzoxazole precursor comprises a repeating unit represented by the following Chemical Formula 1 or both of repeating units represented by the following Chemical Formulae 1 and 2 and a thermally polymerizable functional group derived from a monoamine having a double bond, a monoanhydride having a double bond, or a mixture thereof at at least one end, and the polyamic acid comprises a repeating unit represented by the following Chemical Formulae 50 and 51:

[Chemical Formula 1]

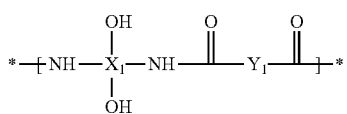

[Chemical Formula 2]

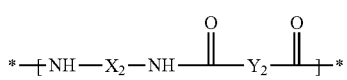

wherein, in Chemical Formulae 1 and 2,
$X_1$ comprises an aromatic organic group or a quadrivalent to hexavalent aliphatic organic group,
$Y_1$ and $Y_2$ are the same or different and independently comprise an aromatic organic group or a divalent to hexavalent aliphatic organic group, and
$X_2$ comprises an aromatic organic group, a divalent to hexavalent aliphatic organic group, a divalent to hexavalent alicyclic organic group, or an organic group represented by the following Chemical Formula 3,

[Chemical Formula 3]

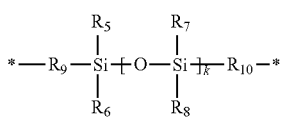

wherein, in Chemical Formula 3,
$R_5$ to $R_8$ are the same or different and independently comprise substituted or unsubstituted alkyl, substituted or unsubstituted aryl, substituted or unsubstituted alkoxy, or hydroxy, $R_9$ and $R_{10}$ are the same or different and independently comprises substituted or unsubstituted alkylene or substituted or unsubstituted arylene, and
k is an integer ranging from 1 to 50,

[Chemical Formula 50]

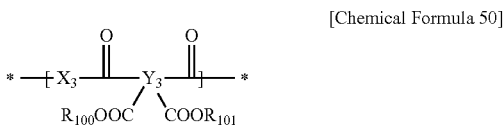

[Chemical Formula 51]

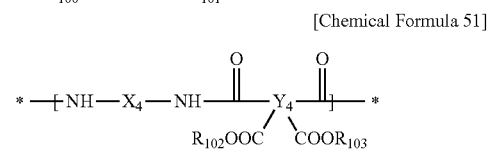

wherein, in Chemical Formulae 50 and 51,
$X_3$ comprises an aromatic organic group or a divalent to hexavalent alicyclic organic group,
$Y_3$ and $Y_4$ are the same or different and independently comprises an aromatic organic group or a quadrivalent to hexavalent alicyclic organic group,
$X_4$ comprises an aromatic organic group, a divalent to hexavalent alicyclic organic group, or a functional group represented by Chemical Formula 3, and
$R_{100}$ to $R_{103}$ are the same or different and independently comprise hydrogen or substituted or unsubstituted C1 to C20 alkyl,
wherein the dissolution-controlling agent comprises a compound of Chemical Formula 18:

[Chemical Formula 18]

wherein, in Chemical Formula 18,
$R_{202}$ is cyclohexyl, and
p" is 1; or the dissolution-controlling agent comprises a combination of a compound of Chemical Formula 17 and a compound of Chemical Formula 18':

[Chemical Formula 17]

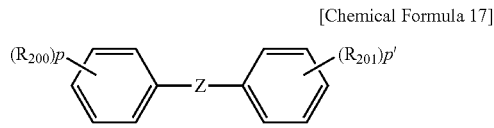

[Chemical Formula 18]

wherein, in Chemical Formulae 17 and 18',
$R_{200}$ to $R_{202}$ are the same or different and independently comprise hydrogen, substituted or unsubstituted alkyl, or substituted or unsubstituted allyl,
p, p', and p" are the same or different and are independently an integer ranging from 1 to 4, and Z comprises O, CO, CONH, $CR_{203}R_{204}$, S, $SO_2$, or a single bond, wherein $R_{203}$ and $R_{204}$ are the same or different and independently comprise hydrogen or substituted or unsubstituted alkyl, and wherein the solvent comprises gamma-butyrolactone, N,N-dimethyl acetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxy propionate, or a mixture thereof.

2. The positive photosensitive resin composition of claim 1, wherein the polybenzoxazole precursor has a weight average molecular weight (Mw) ranging from about 3000 to about 300,000.

3. The positive photosensitive resin composition of claim 1, wherein the dissolution-controlling agent further comprises a hydroxy phenol.

4. The positive photosensitive resin composition of claim 1, wherein the acid generator comprises a photosensitive diazoquinone compound, an onium salt-based compound, a sulfonate-based compound, an oximesulfonate-based compound, a diazomethane-based compound, a nitrobenzylsulfonate-based compound, an iminosulfonate-based compound, a disulfone-based compound, or a mixture thereof.

5. The positive photosensitive resin composition of claim 1, wherein the acid generator includes an acid degradable functional group, and the acid degradable functional group comprises a linear tertiary alkyl group, a tertiary alkyl group including an alicyclic group, a linear alkoxy alkyl group, a tertiary alkyloxycarbonyl group, a tertiary alkoxycarbonyl alkyl group, a cyclic ether, an amyloxycarbonyl, an amyloxycarbonyl alkyl, an acetal group, or a combination thereof.

6. The positive photosensitive resin composition of claim 4, wherein the onium salt-based compound comprises an alkyl sulfonic acid as a negative ion.

7. The positive photosensitive resin composition of claim 6, wherein the onium salt-based compound is represented by the following Chemical Formula 24:

[Chemical Formula 24]

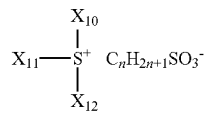

wherein, in Chemical Formula 24,
$X_{10}$ to $X_{12}$ are the same or different and independently comprise substituted or unsubstituted aryl or substituted or unsubstituted alkyl, and n is an integer ranging from 1 to 10.

8. A photosensitive resin layer formed using the positive photosensitive resin composition according to claim 1.

9. A semiconductor device comprising the photosensitive resin layer of claim 8.

10. The positive photosensitive resin composition of claim 1, comprising the dissolution-controlling agent (B) in an amount of about 0.1 to about 10 parts by weight, based on about 100 parts by weight of the resin precursor.

11. The positive photosensitive resin composition of claim 1, comprising the dissolution-controlling agent (B) in an amount of about 0.1 to about 5 parts by weight, based on about 100 parts by weight of the resin precursor.

* * * * *

UNITED STATES PATENT AND TRADEMARK OFFICE
CERTIFICATE OF CORRECTION

PATENT NO. : 9,176,381 B2  
APPLICATION NO. : 12/964010  
DATED : November 3, 2015  
INVENTOR(S) : Jeong-Woo Lee et al.

Page 1 of 1

It is certified that error appears in the above-identified patent and that said Letters Patent is hereby corrected as shown below:

In the Specification

Column 6, Lines 45-50, Chemical Formula 5 is depicted as:

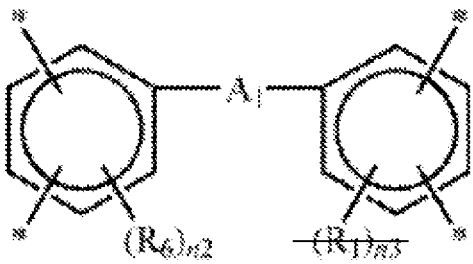

and should be depicted as:

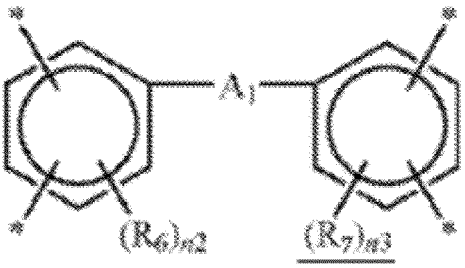

Signed and Sealed this  
Fifth Day of April, 2016

Michelle K. Lee  
*Director of the United States Patent and Trademark Office*